US005565772A

United States Patent [19]
Jeffers

[11] Patent Number: 5,565,772
[45] Date of Patent: Oct. 15, 1996

[54] HIGH SENSITIVITY MAGNETIC VIEWER USING ANHYSTERETIC TRANSFER FOR VIEWING WEAK MAGNETIC PATTERNS

[75] Inventor: Frederick J. Jeffers, Escondido, Calif.

[73] Assignee: Eastman Kodak Company, Rochester, N.Y.

[21] Appl. No.: 346,961

[22] Filed: Nov. 30, 1994

[51] Int. Cl.$^6$ .......................... G01N 27/72; G01R 33/12
[52] U.S. Cl. ............................................ 324/235; 324/260
[58] Field of Search ................................ 324/213–216, 324/235, 262, 260, 261

[56] References Cited

U.S. PATENT DOCUMENTS

| | | | |
|---|---|---|---|
| 3,612,665 | 10/1971 | Vassiliou | 324/214 |
| 4,403,226 | 9/1983 | Gaudioso | 346/74.4 |
| 4,621,192 | 11/1986 | Duthoit et al. | 250/225 |
| 4,755,752 | 7/1988 | Fitzpatrick | 324/228 |

FOREIGN PATENT DOCUMENTS 0091076  4/1989  Japan ..................... 324/213

Primary Examiner—Walter E. Snow
Attorney, Agent, or Firm—William F. Noval

[57] ABSTRACT

A magneto-optic layer of bismuth-garnet deposited on a thin transparent substrate is utilized in viewing very low amplitude magnetic field patterns. When subjected to a magnetic field perpendicular to the layer, the layer lowers its magnetic energy by breaking up into a series of reversed domains called meander patterns. As the magnetic fields to be viewed are too low in amplitude, (approximately equal to, or less than 1 Oe), to directly modify the meander pattern, the magneto-optic layer is excited with an AC magnetic field of more than 100 Oe which is then slowly reduced to zero; (a small DC bias field is simultaneously applied to control the background of the viewed field, and to cancel the earth's field). This causes the anhysteretic transfer of the pattern of the low amplitude field onto the magneto-optic layer, with the resultant meander pattern replicating the low amplitude field pattern. By the Faraday effect, the domains of the magneto-optic layer rotate the plane of polarization of a linearly polarized light beam traversing the layer, and when viewed through crossed polarizers the meander pattern is readily visible.

12 Claims, 2 Drawing Sheets

HIGH SENSITIVITY MAGNETIC VIEWER USING ANHYSTERETIC TRANSFER FOR VIEWING WEAK MAGNETIC PATTERNS

BACKGROUND OF THE INVENTION

1. Field of the Invention

This invention relates to apparatus for viewing the magnetic pattern of a magnetized material, and in particular to a high sensitivity magnetic viewer for viewing low amplitude magnetic fields emanating from a weakly magnetized material.

2. Description Relative to the Prior Art

At least three ways of visually examining a magnetized body to determine its magnetic field distribution are known in the prior art. One way is to apply an aqueous solution of extremely fine iron particles directly to the surface of the magnetized material, and to observe where the particles congregate under the influence of the field originating in the material. This technique, known as the Bitter test, is a sensitive one, but it is untidy and attendantly inconvenient.

A second method utilizes a plastic sheet containing encapsulated Ni flakes dispersed in a liquid. The sheet is placed in contact with the magnetized surface, and the flakes rotate and align themselves with the magnetic field. Light reflected from the planes of the aligned flakes delineates the pattern of the magnetic field. This technique works well for strongly magnetized surfaces, but it will not image moderately strong magnetic layers such as conventional magnetic recording tape. This plastic sheet material is available under the trade name "Magneview".

The third method consists of a thin aluminum membrane stretched across the bottom of a small volume containing ferrite flakes dispersed in water. Using this device, magnetic tapes having low linear density recorded signals can be imaged, but those of moderate density are not imaged because the field from the tape at the surface of the ferrite particle layer is too small. A viewer incorporating this technique is available having the trade name "3M Viewer".

It will be noted that in the techniques practiced in the prior art, the magnetic field directly magnetizes and mechanically positions magnetic particles whose spatial distribution then replicates that of the field, allowing the field pattern itself to become visually discernable. When the field to be detected is too low in amplitude to effect mechanical aligning or positioning of the magnetic particles the techniques of the prior art fail. The present invention does not rely on particle alignment or positioning to provide a visual depiction of a low amplitude magnetic field.

SUMMARY OF THE INVENTION

In the practice of the invention, a magneto-optic layer of bismuth-garnet deposited on a thin transparent substrate is utilized in viewing very low amplitude magnetic field patterns. In the absence of a relatively strong magnetic field perpendicular to the layer, the layer lowers its magnetic energy by breaking up into a series of reversed domains called meander patterns. As the magnetic fields of the pattern to be viewed are too low in amplitude, (approximately equal to, or less than 1 Oe), to directly modify the meander pattern, the invention teaches exciting the magneto-optic layer with a large AC magnetic field which is then slowly reduced to zero; (a small DC bias field is simultaneously applied to allow adjustment of the background of the viewed field, and to cancel the perpendicular component of the earth's field). This causes the anhysteretic transfer of the pattern of the low amplitude field onto the magneto-optic layer, with the resultant domain pattern replicating the low amplitude field pattern. By the Faraday effect, the domains of the magneto-optic layer rotate the plane of polarization of a linearly polarized light beam traversing the layer, and when viewed through crossed polarizers the meander pattern replicating the low amplitude field pattern is readily visible.

BRIEF DESCRIPTION OF THE DRAWINGS

The invention will be described with respect to the figures, of which.

DESCRIPTION OF THE PREFERRED EMBODIMENT

Figure 1:
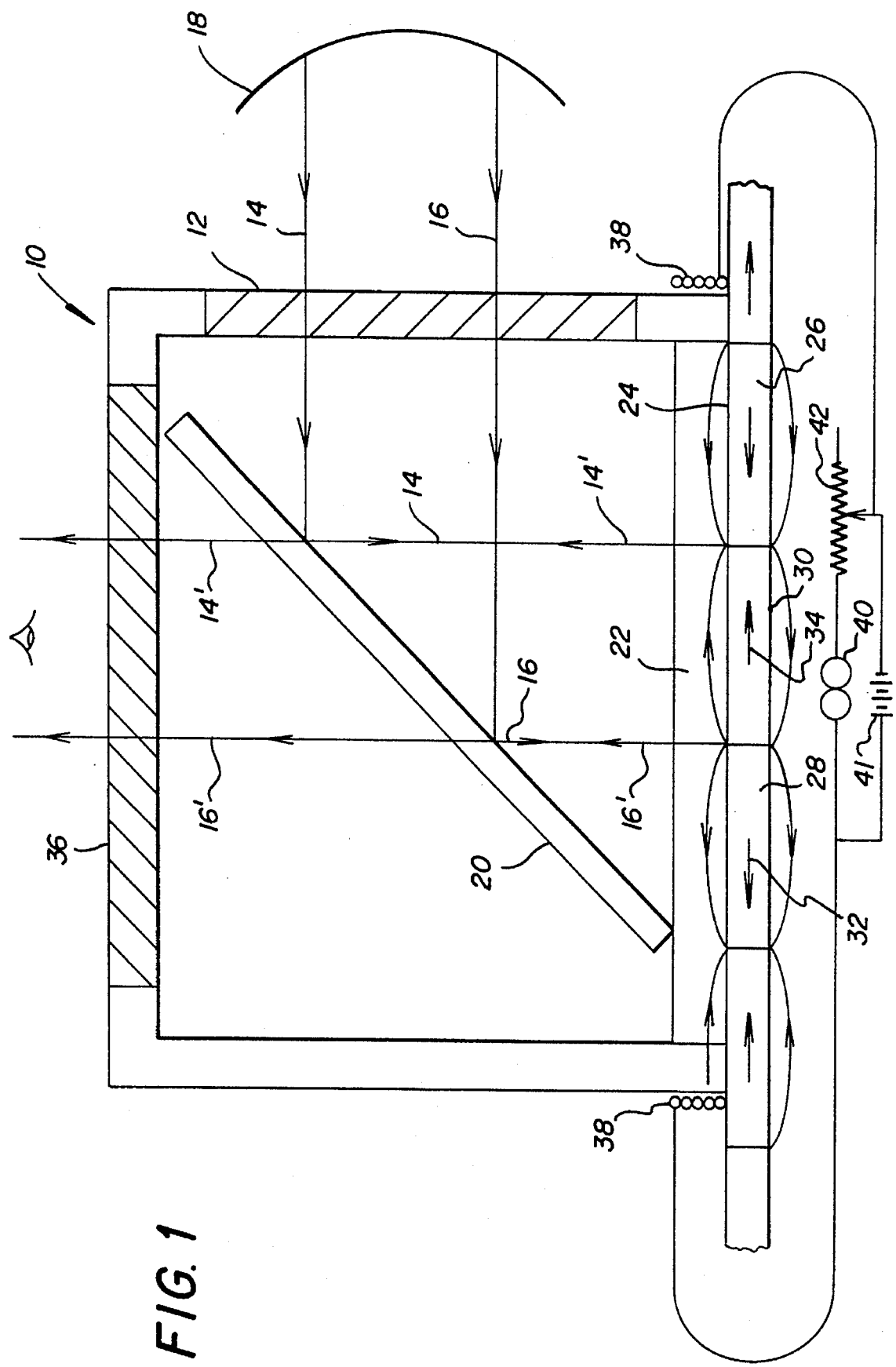
FIG. 1 is a drawing schematically illustrating the invention.

The viewer 10 consists of a box having a polarizer 12 in one wall through which typical light rays 14, 16 from a light source 18 enter the viewer 10. The rays 14, 16 are then reflected downwards from a half-silvered mirror 20 obliquely positioned in the viewer 10. A magneto-optic layer 22, for example, of bismuth-garnet, forms the bottom of the viewer 10 and a reflective surface 24 is deposited on the lower face of the magneto-optic layer 22. Silver or aluminum are suitable materials for deposition to form the reflective surface 24. The viewer 10 is shown in contact with a weakly magnetized material 26, which may be a magnetic tape having recorded digital bits, e.g., 28, 30, where adjacent bits have oppositely directed magnetizations, e.g. 32, 34. The typical light rays 14, 16 traverse the magneto-optic layer 22, are reflected from the bottom reflective surface 24 and emerge from the magneto-optic layer 22 as rays 14', 16'. The rays 14', 16' then pass through the half-silvered mirror and through a polarizing analyzer 36 whose optical axis is crossed with respect to that of the polarizer 12. For purposes of explanation, the rays 14, 16 are shown impinging on the magneto-optic layer 22 at the boundaries of bits 28, 30, but it will be understood that light rays are gathered from substantially the entire magneto-optic layer. At the boundaries of the bits, e.g. 28, 30 there are vertical field components, which are in opposite directions for adjacent bits. These vertical components are the weak field components which are detected for viewing as described below.

As previously stated, the magneto-optic layer is characterized by reversed magnetic domains which arise to minimize the magnetic energy of the layer. Adjacent domains are magnetized in opposite directions, and attendantly rotate the plane of polarization of the magneto-optic layer for adjacent domains in opposite directions. Hence, in viewing the meanders of a layer through cross polarizers alternate bright and dark adjacent regions are visible.

The viewer 10 is provided with a coil encircling the viewer 10 at the level of the magneto-optic layer 22. The coil 38 is so oriented that current through the coil 38 produces a magnetic field perpendicular to the plane of the magneto-optic layer 22. The fields from the magnetic material 26 are too weak to directly influence the meanders of the layer 22. An AC source provides an alternating current through the coil 38, whose amplitude is determined by a controller 42. The current is so regulated as to provide an initial field at the magneto-optic layer 22 of perhaps 100 Oe which exceeds the coercivity of the magneto-optic film, and controller 42 then decreases the current, and the resultant AC field to zero. The AC transfer field is large enough to saturate the magneto-optic layer, but is not so large as to effect the magnetization of the magnetic material 26. This decreasing field at the magneto-optic layer 22 anhysteretically transfers the pattern of the field from the magnetic material 26 to the meander patterns of the magneto-optic layer 22. When the transfer field from the coil 38 falls below the level necessary to switch the domains in the layer 22, the layer 22 retains the last field pattern generated by the addition of the decreasing transfer field to the field of the magnetic source 26, and this pattern replicates the weak field pattern of the magnetic source 26.

In addition to the AC current supplied by the AC source 40, a small DC current from the DC source 41 flows through the coil 38 to generate a small biasing magnetic field at the magneto-optic layer 22. The amplitude and direction of the DC biasing field allows adjustment of the background appearance of the viewed field, and cancels the perpendicular component of the earth's field.

Figure 2:
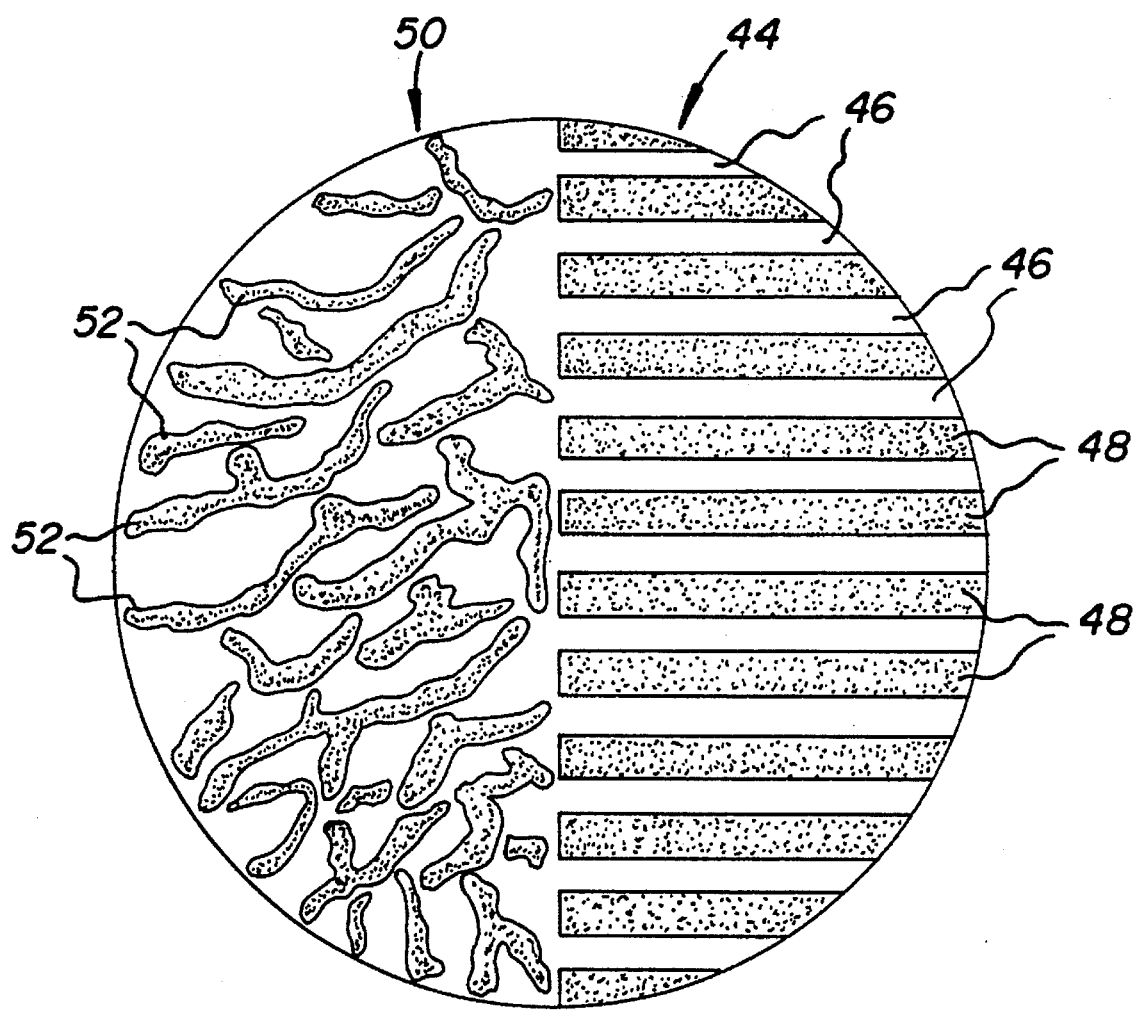
FIG. 2 is a drawing showing a magnetic field pattern observable by means of the invention.

Referring to FIG. 2, the view of the field observed for a digitally recorded tape covering half of the magneto-optic layer is seen; the remainder of the magneto-optic layer being influenced only by its internal magnetic field. The region 44 consists of bright bands 46 alternating with dark bands 48. These alternating bright, 46, and dark, 48, bands correspond to the oppositely directed magnetic fields of the contiguously recorded bits of the digitally recorded magnetic tape under observation. The region 50, to which no external magnetic field was applied, consists of the randomly oriented meanders 52 generated by the internal fields of the magneto-optic layer.

The invention has been described in detail with particular reference to preferred embodiments thereof, but it will be understood that variations and modifications can be effected within the spirit and scope of the invention. For example, rather than the use of a half-silvered mirror to allow folding of the apparatus to provide reduction in size, a linear arrangement of light source, polarizer, transparent magnetic film to be observed, magneto-optic layer and associated anhysteretic transfer field generating apparatus, and optical analyzer allows the practice of the invention by the in-line transmission of light through the above elements.

What is claimed is:

1. Viewer for observing the magnetic field pattern of a magnetized surface, said apparatus comprising:
    a) a magneto-optic layer located adjacent to a magnetized surface having a magnetic field pattern too weak to directly influence said magnetic optic layer,
    b) means for anhysteretically transferring said magnetic field pattern from said magnetized surface to said magneto-optic layer, and
    c) means for optically viewing the polarization pattern of said magneto-optic layer due to said magnetic field pattern.

2. The apparatus of claim 1 wherein said magneto-optic layer is a bismuth-garnet layer.

3. The viewer of claim 1 wherein said means for anhysteretically transferring said magnetic field pattern is means for providing an AC gradually decreasing magnetic field to said magneto-optic layer.

4. The viewer of claim 3 wherein said AC magnetic field is generated by apparatus comprising:
    a) an electrical coil surrounding said magneto-optic layer, wherein said coil is excitable by an AC current to generate said magnetic field, and
    b) a controller for controlling the magnitude of said AC current, whereby said AC field is gradually decreased in amplitude to cause said anhysteretic transfer.

5. The viewer of claim 4 wherein the maximum amplitude of said AC magnetic field at said magneto-optic layer is large enough to saturate said magneto-optic device, and said maximum amplitude of said AC magnetic field at said magnetized surface is not large enough to substantially modify said magnetic field pattern of said magnetized surface.

6. The viewer of claim 3 including means for applying a DC biasing field to said magneto-optic layer.

7. The viewer of claim 1 wherein said means for viewing said polarization pattern includes crossed polarizers.

8. Apparatus for viewing the magnetic field pattern of an associated magnetized material, said apparatus comprising:
    a) a first light polarizing transmission member having a first axis of polarization,
    b) a half-silvered mirror positioned so that a light beam passing through said first light polarizing member is incident on said mirror and is partially reflected,
    c) a magneto-optic layer having an upper planar surface and a lower planar surface, said layer being so oriented that said partially reflected light beam is perpendicularly incident on said layer,
    d) a reflecting layer in contact with said lower planar surface, whereby said partially reflected light beam is reflected from said reflecting layer,
    e) means for positioning said associated magnetized material adjacent to said reflecting layer whereby the magnetic field pattern of said magnetized material is incident onto said magneto-optic layer but is too weak to directly influence said magneto-optic layer,
    f) a gradually decreasing magnetic transfer field applied to said magneto-optic layer whereby said field pattern is anhysteretically transferred to said magneto-optic layer, and
    g) a second polarizing transmission element having a second polarization axis oriented perpendicular to said first polarization axis and wherein said light beam reflected from said reflecting layer traverses said magneto-optic layer and said half-silvered mirror and whereby said light beam has its plane of polarization rotated in accordance with said magnetic pattern.

9. The apparatus of claim 8 wherein said magneto-optic layer is a bismuth-garnet layer.

10. The viewer of claim 8 wherein said AC magnetic field is generated by apparatus comprising:
    a) an electrical coil surrounding said magneto-optic layer, wherein said coil is excitable by an AC current to generate said magnetic field, and
    b) a controller for controlling the magnitude of said AC current, whereby said AC field is decreased in amplitude to cause said anhysteretic transfer.

11. The viewer of claim 10 wherein the maximum amplitude of said AC magnetic field at said magneto-optic layer is large enough to saturate said magneto-optic device, and said maximum amplitude of said AC magnetic field at said magnetized material is not large enough to substantially modify said magnetic field pattern of said magnetized material.

12. The viewer of claim 10 including means for applying a DC biasing field to said magneto-optic layer.

\* \* \* \* \*